(12) United States Patent
Suzuki

(10) Patent No.: US 8,487,576 B2
(45) Date of Patent: Jul. 16, 2013

(54) LOAD DRIVE CONTROL DEVICE AND LOAD DRIVE CONTROL METHOD

(75) Inventor: Masashi Suzuki, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 13/389,717

(22) PCT Filed: Aug. 10, 2010

(86) PCT No.: PCT/JP2010/063574
§ 371 (c)(1),
(2), (4) Date: Feb. 9, 2012

(87) PCT Pub. No.: WO2011/019038
PCT Pub. Date: Feb. 17, 2011

(65) Prior Publication Data
US 2012/0139467 A1 Jun. 7, 2012

(30) Foreign Application Priority Data
Aug. 10, 2009 (JP) ................................. 2009-185797

(51) Int. Cl.
*G05D 23/00* (2006.01)

(52) U.S. Cl.
USPC .......................................................... 318/472

(58) Field of Classification Search
USPC ................. 318/471, 472, 430, 432, 434, 634, 318/400.08, 400.21
See application file for complete search history.

(56) References Cited

U.S. PATENT DOCUMENTS

| | | | | |
|---|---|---|---|---|
| 4,782,272 A * | 11/1988 | Buckley et al. | .......... | 318/400.01 |
| 5,528,114 A * | 6/1996 | Tokizaki et al. | ................ | 318/67 |
| 5,705,907 A * | 1/1998 | Miyamori et al. | ............ | 318/599 |
| 6,111,379 A * | 8/2000 | Feldtkeller | ................... | 318/471 |
| 6,509,708 B2 * | 1/2003 | Cho et al. | ...................... | 318/599 |
| 7,714,524 B2 * | 5/2010 | Frankel et al. | .................. | 318/66 |
| 2005/0237690 A1 * | 10/2005 | Dhuey | .......................... | 361/103 |
| 2010/0171454 A1 * | 7/2010 | Putkinen | ................. | 318/400.26 |

FOREIGN PATENT DOCUMENTS

| | | |
|---|---|---|
| JP | 8-182366 A | 7/1996 |
| JP | 2007-228704 A | 9/2007 |
| JP | 2010-148222 A | 7/2010 |

OTHER PUBLICATIONS

International Search Report [PCT/ISA/210] issued by the International Searching Authority in corresponding International Application No. PCT/JP2010/063574 on Sep. 14, 2010.

Written Opinion [PCT/ISA/237] of the International Searching Authority, issued in corresponding International Application No. PCT/JP2010/063574 on Sep. 14, 2010.

* cited by examiner

*Primary Examiner* — Walter Benson
*Assistant Examiner* — Iftekhar Mustafa
(74) *Attorney, Agent, or Firm* — Sughrue Mion, PLLC

(57) ABSTRACT

A load drive control device includes a driver that drives a load which is operable by a DC drive and a pulse modulation drive, a protecting section that detects an electric current flowing in the driver, a temperature detecting section that detects a high temperature state of the driver, and a control section that determines whether the load is operated by the DC drive or the pulse modulation drive, based on outputs from the protecting section and the temperature detecting section. The control section switches the driver in the DC drive and measures the electric current flowing in the driver when a temperature equal to or higher than a predetermined temperature is detected during the pulse modulation drive.

5 Claims, 6 Drawing Sheets

(a) IN A CASE OF MOTOR OF WHICH L COMPONENT IS SMALL (b) IN A CASE OF MOTOR OF WHICH L COMPONENT IS LARGE

LOAD DRIVE CONTROL DEVICE AND LOAD DRIVE CONTROL METHOD

TECHNICAL FIELD

The present invention relates to a load drive control device and a load drive control method. For example, the present invention relates a load drive control device and a load drive control method for controlling a load such as a pump which is driven in a DC (Direct Currency) drive and a pulse modulation drive.

BACKGROUND ART

As a driving section for driving a load such as a motor of a fuel pump mounted on a vehicle, a DC drive or a pulse modulation drive such as a PWM (Pulse Width Modulation) control is used. And, the operational state of the fuel pump can be controlled by suitably selecting the DC drive, the pulse modulation drive or a stop operation depending on vehicle conditions.

Since the load cannot be suitably driven if the switching element has a trouble, various technologies have been proposed in order to prevent the trouble of the switching element. As a cause of the trouble of the driver (switching element), an overcurrent flowing in the switching element can be considered. As another cause, a case where the temperature of the circuit becomes high can be considered. As the overcurrent is occurred in the switching element, the temperature of the circuit naturally increases. And thus, the trouble of the motor is caused and a suitable preventing means is required.

For example, as a technology for detecting an overcurrent of the motor in order to protect the switching element from a failure due to the overcurrent of the motor, as illustrated in FIG. 1, there is a technology that detects an electric current flowing in the switching element. A FPCM (Fuel Pump Control Module) 110a is a device for controlling the driving of the motor 160 of the fuel pump and includes a MCS (Motor Control System) 120 and an IPS (Intelligent Power Switch) 130. The IPS 130 includes a driver 135 and a self-diagnostic output circuit 140. The driver 135 includes a high side-transistor 131 which is a P channel MOSFET and a low side-transistor 132 which is an N channel MOSFET. And, the MCS 120 drives the motor 160 in the PWM drive by switching the high side-transistor 131 and the low side-transistor 132 using a PWM control. When the motor is driven in the DC drive, the MCS 130 maintains the high side-transistor 131 in the on-state and the low side-transistor 132 in the off-state.

Further, the self-diagnostic output circuit 140 includes a current detecting function for detecting an electric current flowing in the high side-transistor 131 of the driver 135 and a error detecting function for detecting an occurrence of an error. The current detecting function of the self-diagnostic output circuit 140 is adapted to output, for example, one of several thousand of an electric current flowing in the high side-transistor 131. A predetermined resistance is provided between the output part of the current detecting function and a ground part. Also, as a MCS 120 detects a voltage on an output part side of the current sensor function of the resistance, it is determined whether an overcurrent flows in the motor or not.

As another technology, as indicated in the FPCM 110b shown in FIG. 2, there is a technology in which an overcurrent of the driver 135 is estimated by detecting a temperature thereof using a temperature detecting circuit 170 arranged in the vicinity of the IPS 130. Further, in an applied technology for the technology of FIG. 2, restricting values of the electric current are set in a stepwise fashion (for example, Patent Document 1).

Patent Document 1: JP-A-2007-228704

SUMMARY OF INVENTION

Technical Problem

However, in the FPCM 110a shown in FIG. 1, there is a risk that an electric current value cannot be precisely determined when the FPCM is operated in the PWM drive. Specifically, as shown in FIG. 3 (a) illustrating a motor of which L component is small and FIG. 3 (b) illustrating a motor of which L component is large, if a variation is occurred in the inductance component (coil component) of the motor 160, electric currents supplied to the motor 160 can be different from each other even if a switching operation in the driver 135 is same to each other. As a result, even though a current sensor function of the self-diagnostic output circuit 140 is used, it is difficult for the MCS 120 to precisely determine whether the electric current is overcurrent or not. In order to eliminate the difficulty, a thermistor with high precision is required. However, from the viewpoint of a cost, another technology has been required. In addition, as mentioned above, since the electric current in the driver 135 is different from each other due to a variation of a load property, a variation in an amount of heat generation of the driver 135 is occurred and thus it is difficult to precisely determine the overcurrent.

The present invention has been developed in consideration of the above situations and an object thereof is to provide a technology in which a switching element driving a load can be driven within a suitable temperature range.

Solution to Problem

A predetermined aspect of the present invention relates to a load drive control device. This load drive control device includes a driver configured to drive a load which is operable by a DC drive and a pulse modulation drive, a protecting section configured to detect an electric current flowing in the driver, a temperature detecting section configured to detect a high temperature state of the driver, a control section configured to determine whether the load is operated by the DC drive or the pulse modulation drive, based on outputs from the protecting section and the temperature detecting section, and the control section switches the driver in the DC drive and measures the electric current flowing in the driver when a temperature equal to or higher than a predetermined temperature is detected during the pulse modulation drive.

Further, the control section controls the driver so as to perform the DC drive at a constant period when it is determined that the electric current equal to or higher than a predetermined current value flows in the driver during the driver performs the DC drive to the load.

In addition, the protecting section may include a built-in temperature detecting section which is configured to detect a temperature of the driver, and the driver may stop an output to the load when the built-in temperature detecting section detects a temperature equal to or higher than the predetermined temperature.

Another aspect of the present invention relates to a load drive control method. This load drive control method is used in a device for driving a motor of a fuel pump in a DC drive or a pulse modulation drive using an IPS having a switching element and a self-protection function. This load drive control method includes a detection step of detecting an electric current flowing in the switching element and a temperature in a vicinity of the switching element, and a switching step of switching the driving mode of the motor to the DC drive when the temperature detected in the detecting step is equal to or higher than a predetermined temperature during the pulse modulation drive of the motor.

Further, the load drive control method may further include a retry driving step of controlling to perform the DC drive to the motor at a constant period when an electric current flowing in the switching element is equal to or higher than a predetermined current value during the DC drive to the motor.

Advantageous Effects of Invention

According to the present invention, the switching element for driving a load can be driven within a suitable temperature range.

BRIEF DESCRIPTION OF DRAWINGS

FIG. 3 (a) illustrates a motor of which L component is small and FIG. 3 (b) illustrates a motor of which L component is large.

DESCRIPTION OF EMBODIMENTS

Hereinafter, an embodiment for carrying out the present invention (hereinafter, referred to as "embodiment") will be described by referring to accompanying drawings. In the present embodiment, a motor of a fuel pump mounted on a vehicle is selectively operated in a DC drive or a PWM drive according to the operational state of the vehicle. In a normal state, the PWM drive is selected under a low load condition such as an idling or low speed running condition and the DC drive as selected under a high load condition such as an acceleration or high speed running condition. Meanwhile, when it is determined that a temperature in the vicinity of a switching element for the PWM drive is high during the PWM drive, the motor is driven in the DC drive in order to determine with high precision whether an abnormal or malfunction is occurred or not.

Figure 1:
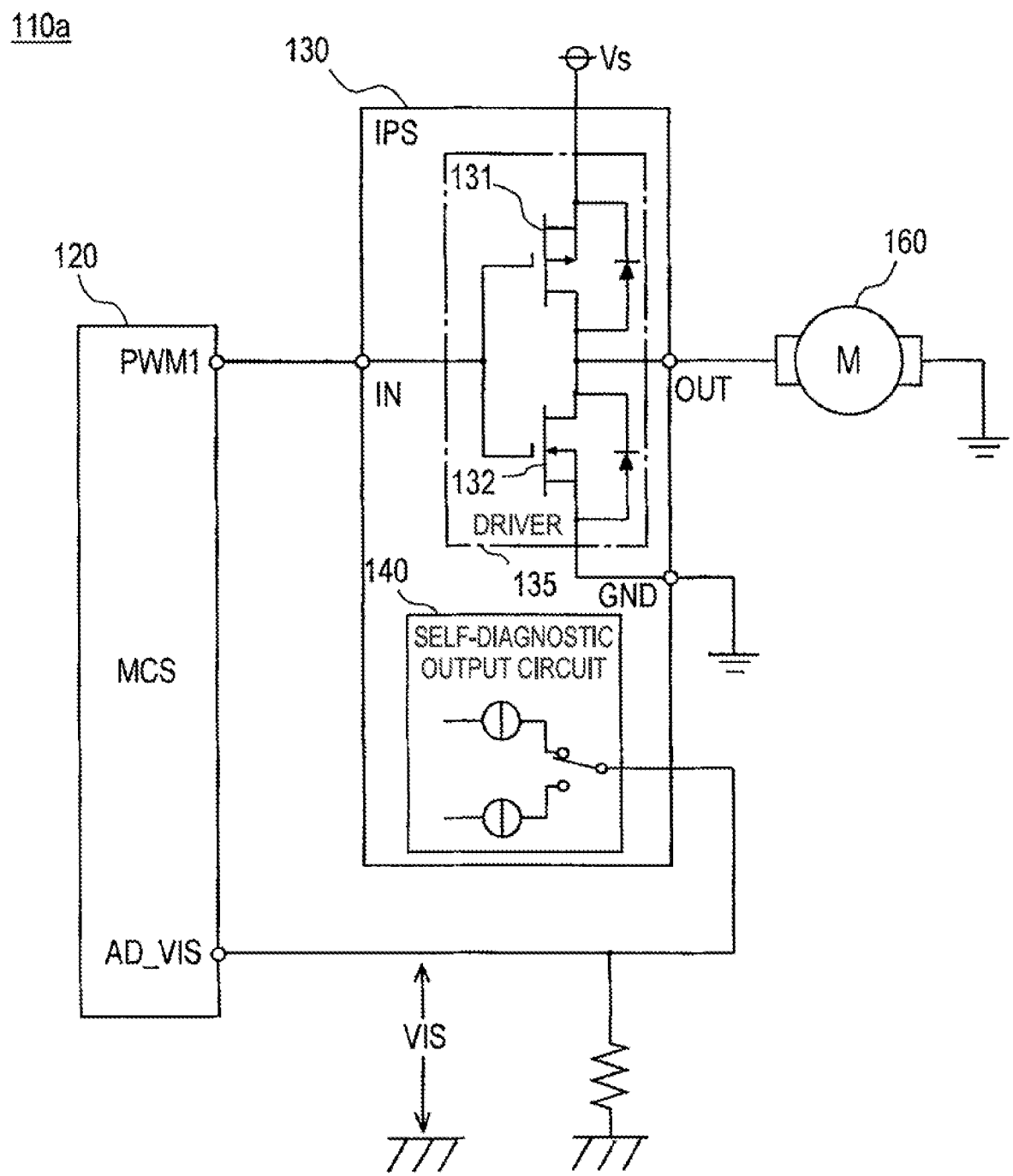
FIG. 1 is a functional block diagram illustrating schematic configuration of a FPCM driving a fuel pump in the prior art.
Figure 2:
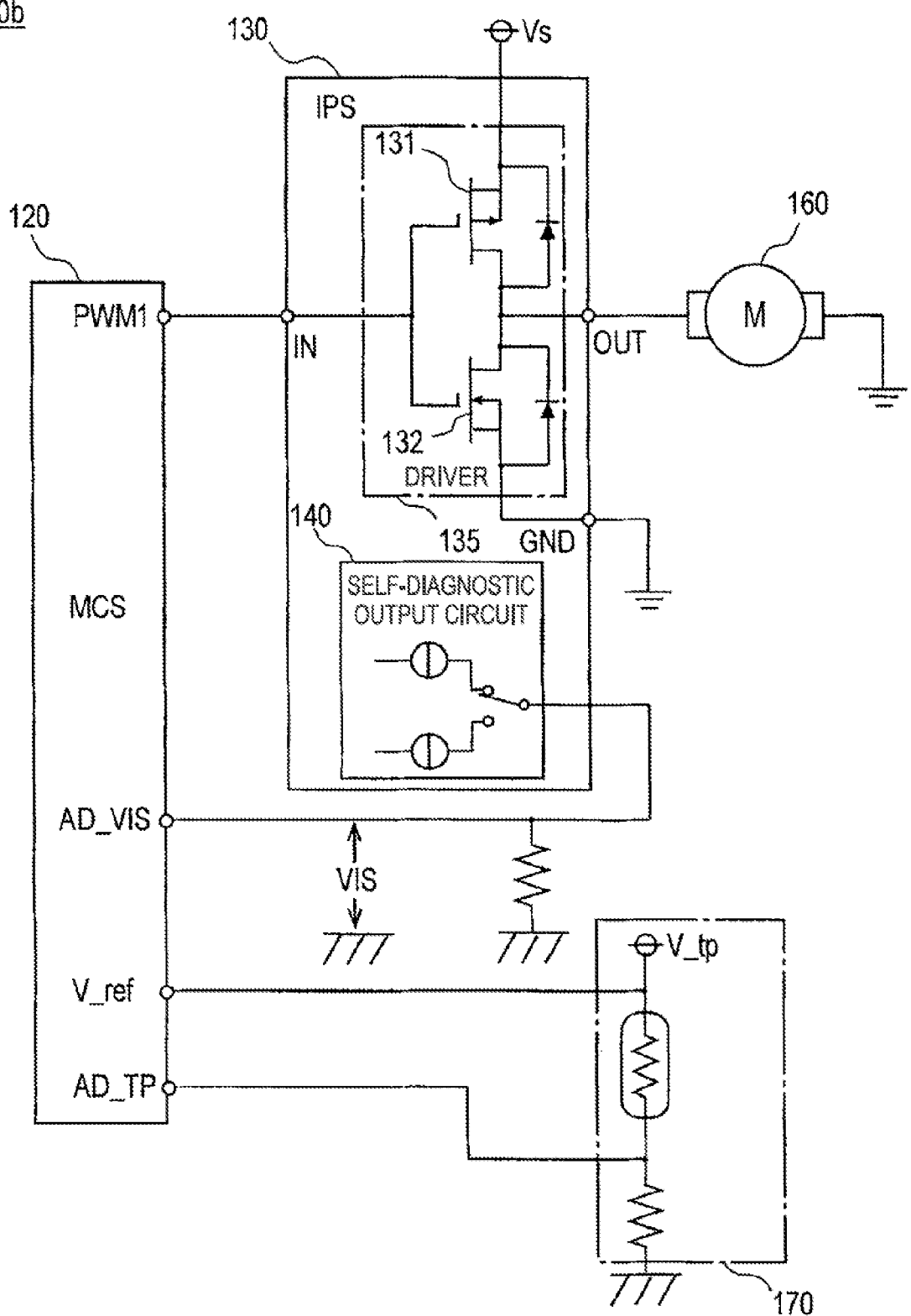
FIG. 2 is a functional block diagram illustrating schematic configuration of a FPCM driving a fuel pump in the prior art.
Figure 3:
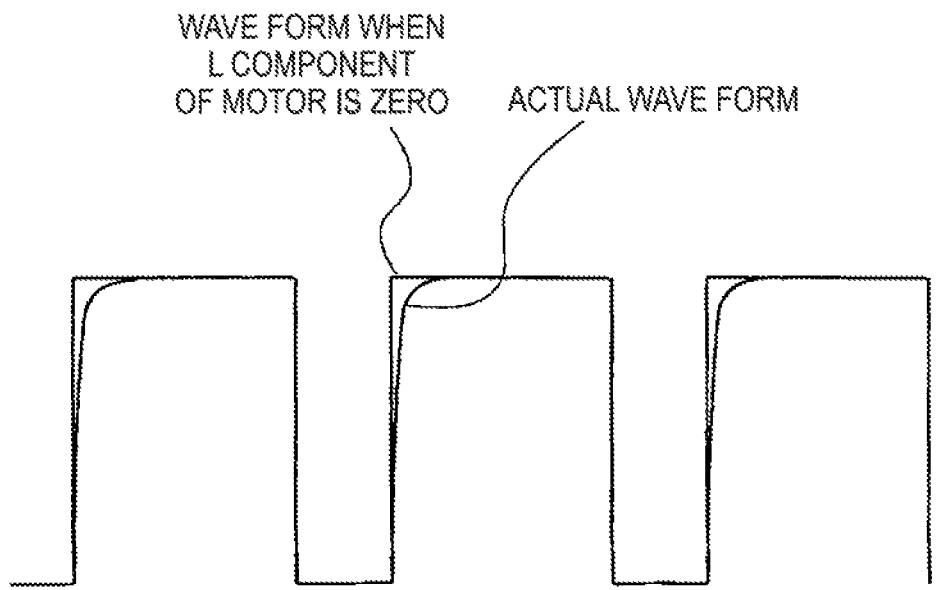
FIG. 3 is a view illustrating an example of an ideal wave form and an actual wave form of a voltage signal which is detected by a MCS depending on the variation in the inductance of the motor of the fuel pump in the prior art.
Figure 3:
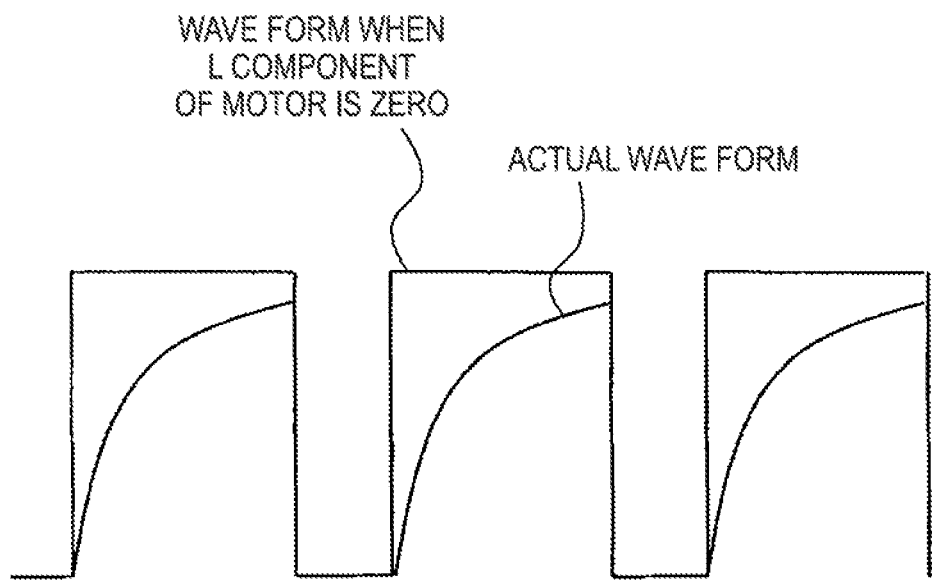
Figure 4:
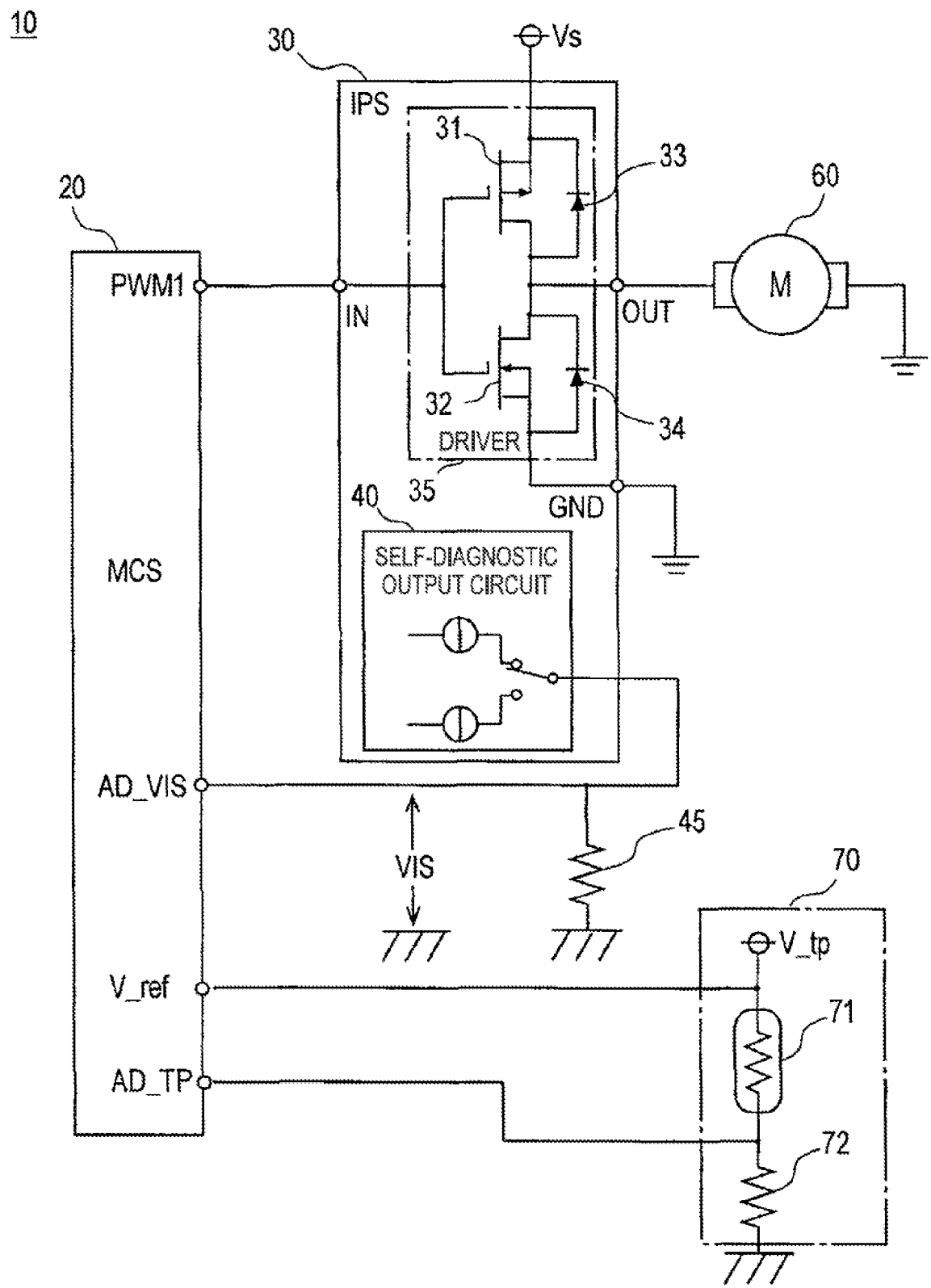
FIG. 4 is a functional block diagram illustrating schematic configuration of a FPCM driving a motor of a fuel pump in the embodiment of the present invention.

FIG. 4 is a functional block diagram illustrating a schematic configuration of the FPCM 10 which drives the motor 60 of the fuel pump in the present embodiment. The fuel pump is, for example, mounted on a vehicle, and the motor 60 included in the fuel pump is driven by the DC drive and PWM drive. In the meantime, PDM (Pulse Density Modulation) drive may be employed as a pulse modulation drive in place of the PWM drive.

The FPCM 10 includes a MCS 20 and an IPS 30. The IPS 30 includes a driver 35 constituted with a switching element and a self-diagnostic output circuit 40 for realizing a self-protection function of the IPS 30 and drives the motor 60. The IPS 30 can employ a well known circuit.

The driver 35 includes a high side-transistor 31 and a low side-transistor 32. In the pulse modulation drive (PWM drive), the driver 35 is pulse-driven by a control signal from the MCS 20 to supply an electric current to the motor 60. Further, when the motor 60 is driven in the DC drive, the driver 35 fixes the high side-transistor 31 in an on-state and the low side-transistor 32 in an off-state to supply a desired electric current to the motor 60 in accordance with on fixing state.

Specifically, the high side-transistor 31 is a P channel MOSFET (Metal-Oxide-Semiconductor Field-Effect Transistor) and has a source and a drain. The source is connected to a power supply potential Vs and the drain is connected to a drain of the low side-transistor 32 and also connected to an output terminal OUT which supplies electric power to the motor 60. Further, a gate thereof is connected to an input terminal IN into which a control signal of the MCS 20 is input. Meanwhile, a diode 33 is provided between the source and drain of the high side-transistor 31. In this diode, a direction from the drain toward the source is referred to as a rectification direction.

The low side-transistor 32 is an N channel MOSFET and has a source and a drain. The source is connected to a ground potential via a ground terminal GND and the drain is connected to a drain of the high side-transistor 31 and also connected to an output terminal OUT which supplies electric power to the motor 60. Further, similar to the high side-transistor 31, a gate thereof is connected to an input terminal IN into which a control signal of the MCS 20 is input. Meanwhile, a diode 34 is provided between the source and drain of the low side-transistor 32. In this diode, a direction from the drain toward the source is referred to as a rectification direction.

The IPS 30 has a self-protection function. For example, when a voltage equal to or higher than a predetermined protection voltage value (IPS self-protection voltage), an electric current value equal to or higher than a predetermined protection current value (IPS self-protection current), or a temperature equal to or higher than a predetermined protection temperature (IPS self-protection temperature) is detected, the function of the ISP 30 is stopped itself. The self-diagnostic output circuit 40 further includes a signal output function when an output is stopped by the above self-protection function and a current sensor function which outputs one of several thousand of an electric current flowing in the high side-transistor 31 during a normal state. A predetermined resistance 45 is provided between an output part of the current sensor function and a ground part. And, by detecting a voltage on an output part side of the current sensor function of the resistance 45 by a MCS 20 which will be described later, it is determined whether an overcurrent flows in the motor 60 or not.

Further, a temperature detecting circuit 70 is provided in the vicinity of the IPS 30. The temperature detecting circuit 70 has a configuration that a thermistor 70 and a resistance 72 are connected in series from a power supply terminal V_tp. And, an electric potential of the power supply terminal V_tp is connected to a reference voltage input terminal V_ref and an electrical potential of the resistance 72 side of the thermistor 71 is connected to a temperature detecting terminal AD_TP.

The MCS 20 outputs a control signal for driving the driver 35 of the IPS 30 to the driver 35 of the IPS 30 via the control signal output terminal PWM1. The MCS 20 outputs a PWM modulation signal when the PWM drive is performed and outputs a lock signal when the DC drive is performed. At this time, a driving frequency of the PWM drive is, for example, about 6 kHz. In addition, the MCS 20 takes a signal from the self-diagnostic output circuit 40 of the IPS 30 as mentioned above via a protection signal input terminal AD_VIS to determine the state of an electric current flowing in the high side-transistor 31 of the driver 35. In addition, the MCS 20 determines a temperature in the vicinity of the IPS 30, based on a voltage of the thermistor 70 of the temperature detecting circuit 70 acquired via the reference voltage input terminal V_ref and the temperature detecting terminal AD_TP.

And, in a normal control state, the MCS 20 outputs a control signal for the PWM drive under a low load condition and outputs a control signal for the DC drive under a high load condition. Also, when it is determined that an overcurrent flows in the motor 60 or there is a possibility where an overcurrent flows in the motor, the MCS 20 performs control modes of the motor according to the fail-safe control I, which will be described as follows.

Figure 5:
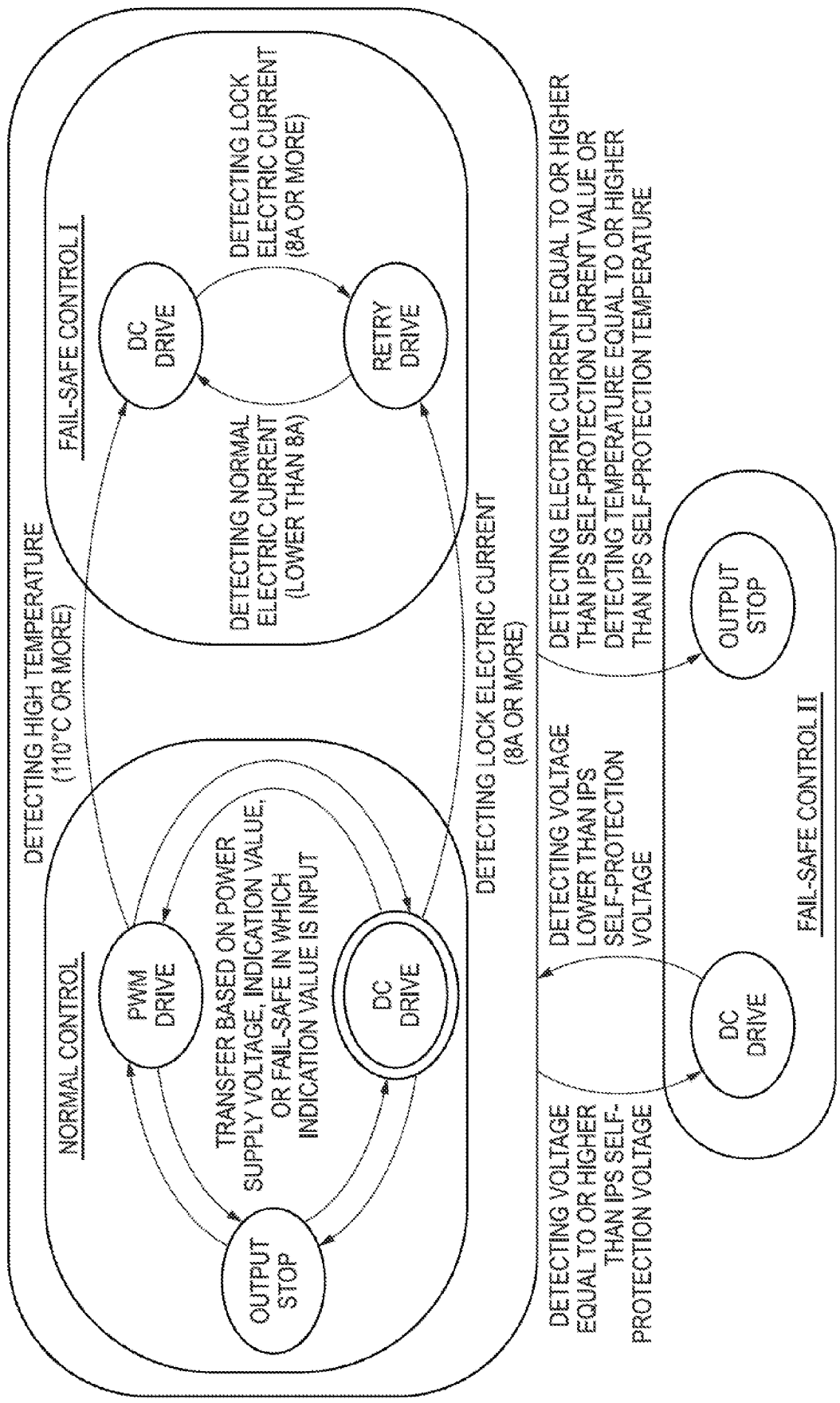
FIG. 5 is a state switching diagram illustrating a switching of the control state of the FPCM driving the motor of the fuel pump in the embodiment of the present invention.

FIG. 5 is a state switching diagram illustrating a switching of the control state of the FPCM 10. By referring to the state switching diagram, a control state such as a normal control state and a fail-safe control state will be described.

In the normal control state, the MCS 20 switches the operational state of the motor 60 to the PWM drive, the DC drive or the power stop, based on a power supply voltage, an indication value or a fail-safe in which the indication value is input. The MCS 20 always monitors the output of the self-diagnostic output circuit 40 or the output of the temperature detecting circuit 70 and determines whether an abnormal is occurred or not, based on the output. When it is determined that an abnormal is occurred, the MCS 20 switches the control state of the motor 60 to the ail-safe control I.

Figure 6:
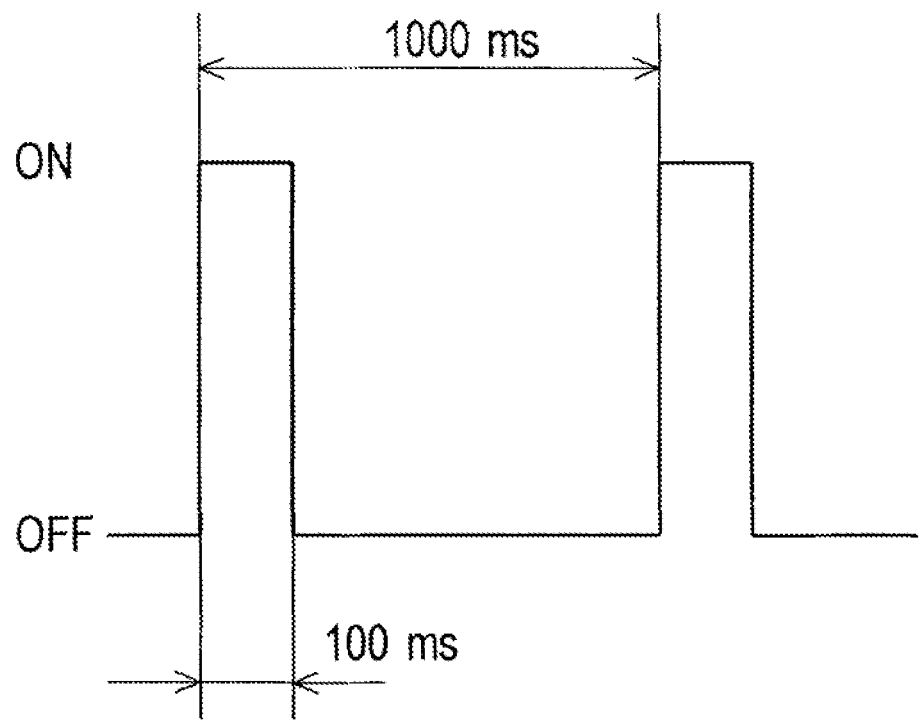
FIG. 6 is a view illustrating an example of a control signal when the motor of the fuel pump is driven in a retry drive in the embodiment of the present invention.

Specifically, when the PWM drive is performed in the normal control state, the MCS 20 calculates a temperature of the IPS 30 based on an output of the temperature detecting circuit 70. And, when the temperature of the IPS is determined as being equal to or higher than a predetermined temperature, for example, 110° C., from the calculation result, the MCS 20 switches the control state of the motor 60 from the PWM drive to DC drive according to the fail-safe control I for more precise determination. Further, when an electric current value in the DC drive is calculated as being equal to or higher than a predetermined value, for example, 8A, based on the output of the self-diagnostic output circuit 40, the MCS 20 switches the control state of the motor 60 to a retry drive according to the fail-safe control I. An electric current value as a critical value is referred to as a lock current value when the control state of the motor is switched to the retry drive. And, in the retry drive, as shown in FIG. 6, the DC drive is performed during 100 ms within approximately one second (i.e., approximately a period of one second). Also, in addition to an improvement in the overcurrent detection or the temperature measuring accuracy, the retry drive can solve a clogging problem of a fuel pump driven by the motor 60.

When a normal current detection is determined by the retry drive, that is, when the electric current is determined as being lower than 8A, the MCS 20 switches the drive control of the motor 60 to the DC drive.

Further, in a normal control state or the fail-safe control I, when the IPS 30 detects a voltage equal to or higher than the IPS self-protection voltage value, a current value larger than the IPS self-protection current value, or a temperature equal to or higher than the IPS self-protection temperature, the IPS 30 switches the control state of the motor 60 to the fail-safe control II.

At this time, in the fail-safe control II, when the control state of the motor is switched based on the IPS self-protection voltage, the IPS 30 switches the driver 35 from a driving state to a lock state and causes the DC power to be output. When the IPS detects a voltage lower than the IPS self-protection voltage, the IPS 30 switches the control state of the motor to the normal control state.

In addition, when the control state of the motor is switched based on the detected IPS self-protection current value or IPS self-protection temperature, the IPS 30 stops a power transferring from the driver 35 to the motor 60 and notifies the engine EUC (not-illustrated) that the power is stopped. And then, the engine EUC receiving the notice temporarily turns off an ignition operation as a return action and restarts the control operation of the FPCM 10.

Hereinabove, according to the above embodiment, regardless of a coil component (inductance L) of the motor 60, an overcurrent can be detected. Accordingly, the switching element (high side-transistor or low side-transistor) can be suitably used within a usable temperature range. As a result, since a stress giving an adverse effect to the switching element is not occurred, service life of a product can be suitably assured. Further, a general purpose switching element circuit (IPS 30) or a general thermistor (71) can be used to save a cost.

Further, it is possible to suppress a heat dissipation of the switching element to a level in which the usage of a heat sink is not required. Specifically, a desired heat dissipation can be realized just by slightly widening a gap between the wiring patterns of the printed board. Accordingly, a miniaturization and a weight saving of the FPCM 10 can be realized.

Hereinabove, the present invention has been explained by referring to the above embodiment. Those skilled in the art can easily appreciate that the above embodiment is only intended to be illustrative, each component of the above embodiment and a combination thereof can be variously modified and these modifications fall within the scope of the present invention.

Although the particular embodiment of the present invention has been described in detail, it is apparent that those skilled in the art can make various modifications and variations to the invention without departing from the spirit and scope of the present invention.

This application is based upon and claims the benefits of priority from Japanese Patent Application No. 2009-185797, filed on Aug. 10, 2009, the content of which is incorporated herein by reference.

REFERENCE SIGNS LIST

10 FPCM
20 MCS
30 IPS
31 High side-transistor
32 Low side-transistor
35 Driver
40 Self-diagnostic output circuit
60 Motor
70 Temperature detecting circuit
71 Thermistor

The invention claimed is:
1. A load drive control device comprising:
a driver that drives a load which is operable by a DC drive and a pulse modulation drive;

a protecting section that detects an electric current flowing in the driver;

a temperature detecting section that detects a high temperature state of the driver; and a control section that determines whether the load is operated by the DC drive or the pulse modulation drive, based on outputs from the protecting section and the temperature detecting section, wherein the control section switches the driver in the DC drive and measures the electric current flowing in the driver when a temperature equal to or higher than a predetermined temperature is detected during the pulse modulation drive.

2. The load drive control device according to claim 1, wherein the control section controls the driver so as to perform the DC drive at a constant period when it is determined that the electric current equal to or higher than a predetermined current value flows in the driver during the driver performs the DC drive to the load.

3. The load drive control device according to claim 1, wherein the protecting section includes a built-in temperature detecting section which detects a temperature of the driver; and wherein the driver stops an output to the load when the built-in temperature detecting section detects a temperature equal to or higher than a predetermined temperature.

4. A load drive control method used in a device for driving a motor of a fuel pump in a DC drive or a pulse modulation drive using an IPS having a switching element and a self-protection function, the load drive control method comprising;

a detection step of detecting an electric current flowing in the switching element and a temperature in a vicinity of the switching element; and a switching step of switching the driving mode of the motor to the DC drive when the temperature detected in the detecting step is equal to or higher than a predetermined temperature during the pulse modulation drive of the motor.

5. The load drive control method according to claim 4, further comprising:

a retry driving step of controlling to perform the DC drive to the motor at a constant period when an electric current flowing in the switching element is equal to or higher than a predetermined current value during the DC drive to the motor.

* * * * *